US008593791B2

(12) United States Patent
Baird et al.

(10) Patent No.: US 8,593,791 B2
(45) Date of Patent: Nov. 26, 2013

(54) SEALED CIRCUIT BREAKER

(75) Inventors: Neil Baird, Kitchener (CA); Nabil Mina, Roselle, IL (US); Yogesh Kanole, Maharashtra (IN)

(73) Assignee: EGS Electrical Group, LLC, Rosemont, IL (US)

( * ) Notice: Subject to any disclaimer, the term of this patent is extended or adjusted under 35 U.S.C. 154(b) by 189 days.

(21) Appl. No.: 13/212,966

(22) Filed: Aug. 18, 2011

(65) Prior Publication Data

US 2012/0043105 A1 Feb. 23, 2012

(30) Foreign Application Priority Data

Aug. 18, 2010 (IN) ........................ 2321/MUM/2010

(51) Int. Cl.
*H02B 1/04* (2006.01)
*H05K 5/06* (2006.01)

(52) U.S. Cl.
USPC ........... 361/643; 361/634; 361/641; 361/648; 361/673; 174/50.5; 174/50.52; 200/50.02; 200/50.06

(58) Field of Classification Search
USPC ............ 361/679.01, 600, 605, 611, 612, 613, 361/624, 627, 629, 634, 641, 643, 652, 656, 361/657, 658, 648, 800–802; 174/50, 50.5, 174/50.51–50.54, 17 VA, 35 R, 541, 561, 174/67, 52, 52.1, 52.3; D13/162, 184; 312/223.2, 223.3, 236, 265; 200/50, 200/293, 296, 297, 50.02, 335, 332, 330; 218/157, 34, 35; 335/2, 202, 172, 190, 335/23, 167
See application file for complete search history.

(56) References Cited

U.S. PATENT DOCUMENTS 2,786,936 A 3/1957 Appleton
3,264,443 A * 8/1966 Kelly et al. .................. 200/331

(Continued)

FOREIGN PATENT DOCUMENTS

CA 2373527 6/2002
CA 2373527 A1 6/2002

(Continued)

OTHER PUBLICATIONS

A.T.X. Catalog "Electrical Equipment for Hazardous Areas," pp. 42, 144, 146, 152, 153, 162-167 (1998).

(Continued)

*Primary Examiner* — Michail V Datskovskiy
(74) *Attorney, Agent, or Firm* — McDonnell Boehnen Hulbert & Berghoff

(57) ABSTRACT

A sealed electrical enclosure used in hazardous locations for enclosing circuit breakers having a bottom housing and a removable top housing with a labyrinth joint or serrated joint formed therebetween, the bottom housing adapted to receive one or more circuit breakers, a first metal bus extending from a point internal to the bottom housing through a first end wall to a point external thereto, and a second metal bus extending from a point internal to the bottom housing through a second end wall to a point external to thereto, where the first and second metal buses are adapted to contact first and second electrical terminals of a circuit breaker when placed within the bottom housing, and a first lug retaining bracket secured to the bottom housing and extending to a position beneath the first metal such that a bottom portion of a connector assembly may fit within the space between the end of the lug retaining bracket and the bottom of the first metal bus.

32 Claims, 21 Drawing Sheets

(56) References Cited

U.S. PATENT DOCUMENTS

| | | | | |
|---|---|---|---|---|
| 3,335,238 | A * | 8/1967 | Zavertnik et al. | 200/50.06 |
| 3,575,007 | A | 4/1971 | Gunther | |
| 3,675,007 | A | 7/1972 | Appleton et al. | |
| 3,986,081 | A | 10/1976 | Norden | |
| 4,034,170 | A | 7/1977 | Raabe et al. | |
| 4,156,121 | A | 5/1979 | Klein et al. | |
| 4,180,177 | A | 12/1979 | Gunderman et al. | |
| 4,260,863 | A | 4/1981 | Appleton | |
| 4,454,565 | A * | 6/1984 | Krasij et al. | 361/673 |
| 4,620,061 | A | 10/1986 | Appleton | |
| 4,717,987 | A | 1/1988 | Newmark et al. | |
| 4,783,718 | A | 11/1988 | Raabe et al. | |
| 4,791,258 | A * | 12/1988 | Youtz et al. | 200/302.1 |
| 4,894,632 | A | 1/1990 | Castonguay et al. | |
| 4,913,503 | A | 4/1990 | Castonguay et al. | |
| 4,914,262 | A | 4/1990 | Appleton | |
| 4,965,414 | A | 10/1990 | Sobotka et al. | |
| 4,965,544 | A | 10/1990 | Kelaita, Jr. et al. | |
| 4,978,816 | A | 12/1990 | Castonguay et al. | |
| 5,070,361 | A | 12/1991 | Magnon et al. | |
| 5,111,362 | A | 5/1992 | Flamm et al. | |
| 5,117,074 | A | 5/1992 | Yanai et al. | |
| 5,117,210 | A * | 5/1992 | Castonguay et al. | 335/172 |
| 5,151,564 | A | 9/1992 | Rowe | |
| 5,202,538 | A | 4/1993 | Skirpan | |
| 5,260,531 | A | 11/1993 | Yarbrough et al. | |
| 5,272,296 | A | 12/1993 | Robarge et al. | |
| 5,286,935 | A | 2/1994 | Mina et al. | |
| 5,334,939 | A | 8/1994 | Yarbrough | |
| 5,351,165 | A | 9/1994 | Hancock | |
| 5,362,933 | A | 11/1994 | Kutsche et al. | |
| 5,410,446 | A | 4/1995 | Wright et al. | |
| 5,414,584 | A | 5/1995 | Young | |
| 5,457,296 | A | 10/1995 | Neill et al. | |
| 5,577,603 | A | 11/1996 | Bogdanovs et al. | |
| 5,597,991 | A | 1/1997 | Chen et al. | |
| 5,607,047 | A | 3/1997 | Leet et al. | |
| 5,634,553 | A | 6/1997 | Hopper et al. | |
| 5,663,862 | A | 9/1997 | Hopping-Mills | |
| 5,717,182 | A | 2/1998 | Mina et al. | |
| 5,721,667 | A | 2/1998 | Rose | |
| 5,753,878 | A | 5/1998 | Doughty et al. | |
| 5,838,219 | A | 11/1998 | Du et al. | |
| 5,857,563 | A | 1/1999 | Helmer et al. | |
| 5,870,278 | A | 2/1999 | Girard et al. | |
| 5,886,868 | A | 3/1999 | White et al. | |
| 5,894,404 | A | 4/1999 | Vrnak et al. | |
| 5,902,973 | A | 5/1999 | Ramey et al. | |
| 5,911,316 | A | 6/1999 | Chu | |
| 5,936,214 | A | 8/1999 | Phillips | |
| 5,969,587 | A | 10/1999 | Combas | |
| 6,040,543 | A | 3/2000 | Mina et al. | |
| 6,087,609 | A | 7/2000 | Thilker et al. | |
| 6,100,481 | A | 8/2000 | Castonguay et al. | |
| 6,166,343 | A | 12/2000 | Blessitt et al. | |
| 6,194,983 | B1 | 2/2001 | Bogdon et al. | |
| 6,229,692 | B1 | 5/2001 | Stendardo et al. | |
| 6,762,662 | B2 * | 7/2004 | Lee et al. | 335/2 |
| 6,838,962 | B2 | 1/2005 | Leone et al. | |
| 6,989,996 | B2 | 1/2006 | Wells et al. | |
| 7,034,241 | B2 * | 4/2006 | Fleege et al. | 218/157 |
| 7,400,239 | B2 | 7/2008 | Kiko et al. | |
| 7,907,389 | B2 * | 3/2011 | Baird et al. | 361/643 |
| 8,223,475 | B2 * | 7/2012 | Baird et al. | 361/643 |
| 8,420,962 | B2 * | 4/2013 | Dudal et al. | 200/50.02 |
| 2004/0045796 | A1 | 3/2004 | Azzola et al. | |
| 2004/0196640 | A1 | 10/2004 | Wells et al. | |
| 2006/0291148 | A1 | 12/2006 | Kelly et al. | |
| 2010/0033907 | A1 | 2/2010 | Baird et al. | |

FOREIGN PATENT DOCUMENTS

| | | | |
|---|---|---|---|
| DE | 8805069 | | 8/1988 |
| EP | 000478432 | A1 * | 4/1992 |
| FR | 2622734 | | 11/1987 |
| FR | 2622734 | A1 | 11/1987 |

OTHER PUBLICATIONS

Photos 1-5 of a crouse-hinds breaker obtained approx. Jun. 2006.
Legrand A.T.X. Catalogue, pp. 2, 4, 5, 10 (1987-88).
International Application No. PCT/US2010/036442 International Search Report and Written Opinion date Nov. 30, 2010.
Google Translation of DE8805069 Nov. 3, 2011.
"Crouse-Hinds" Catalogue pp. 526-527 (2002).
A.T.X. Catalog, "Electrical Equipment for Hazardous Areas," 1998, pp. 42, 144, 146, 152, 153, 162-167.
Legrand A.T.X. Catalogue, 1987-1988, pp. 2, 4, 5, 10.
International Search Report for International Application No. PCT/2010/036442, Nov. 30, 2010, pp. 1-3.
Written Opinion for International Application No. PCT/2010/036442, Nov. 30, 2010, pp. 1-4.
International Search Report for International Application No. PCT/US2011/048114 dated Feb. 23, 2012, pp. 1-5.
International Preliminary Report on Patentability and Written Opinion for International Application No. PCT/US2011/048114 issued Feb. 19, 2013, pp. 1-9.
Google Translation of DE8805069, Nov. 3, 2011, pp. 1-14.
"Crouse-Hinds" Catalogue, 2002, pp. 526-527.

* cited by examiner

FIGURE 8
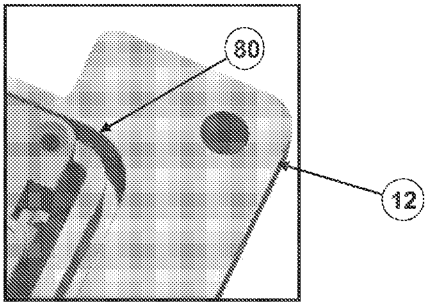
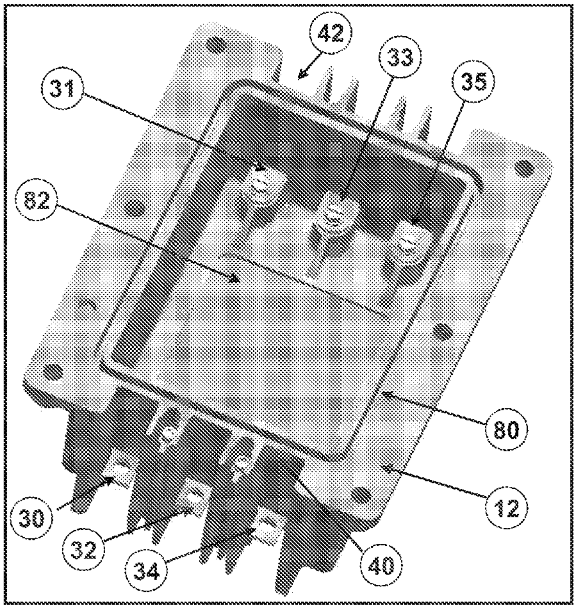
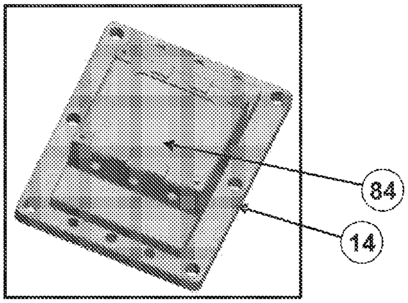
FIGURE 7
FIGURE 9

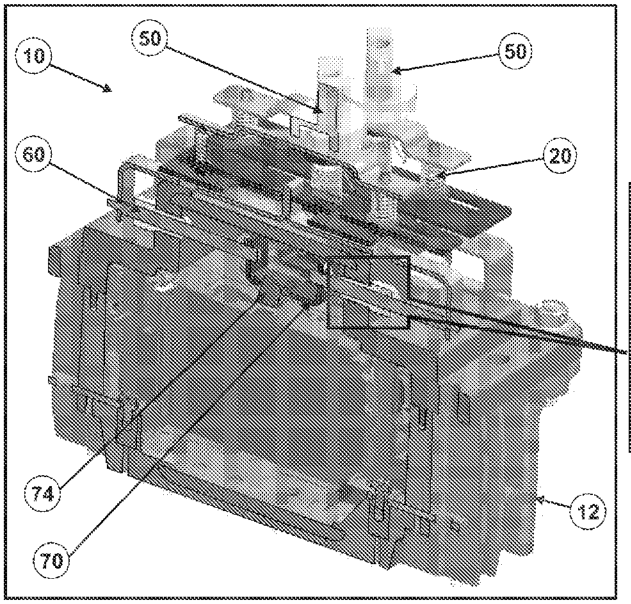
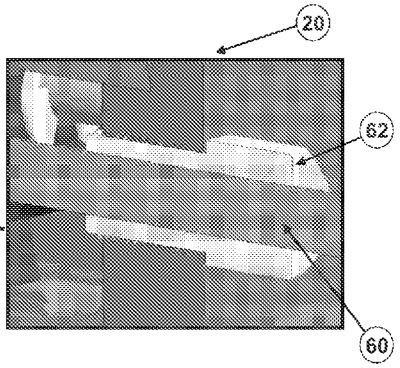
FIGURE 11
FIGURE 10

FIGURE 19c
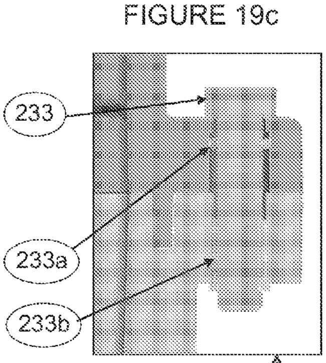
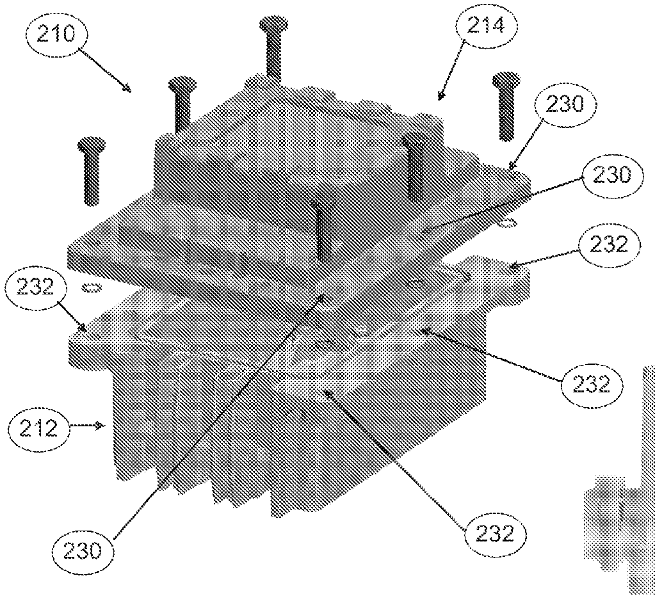
FIGURE 19a
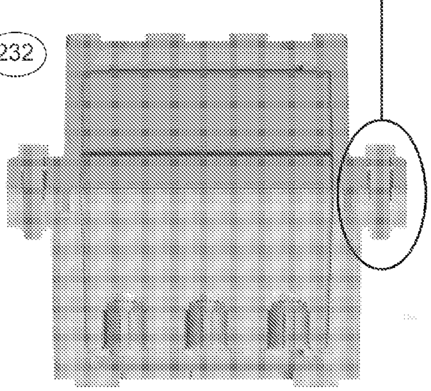
FIGURE 19b

FIGURE 21b
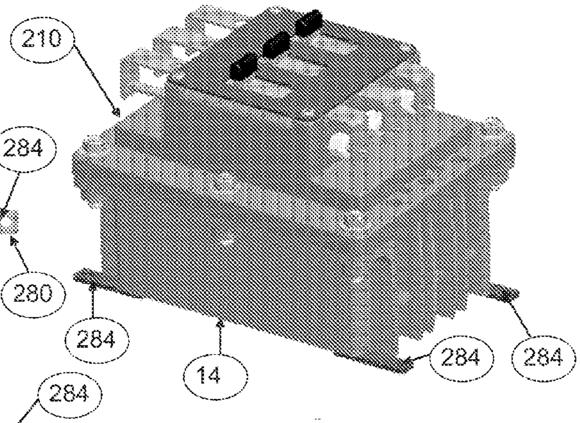
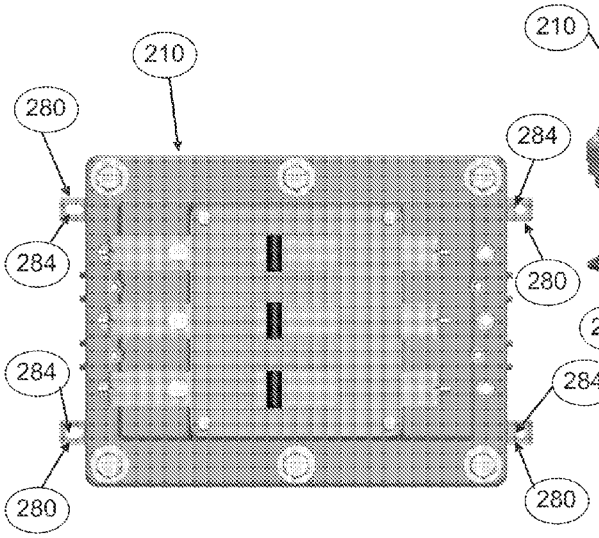
FIGURE 21a
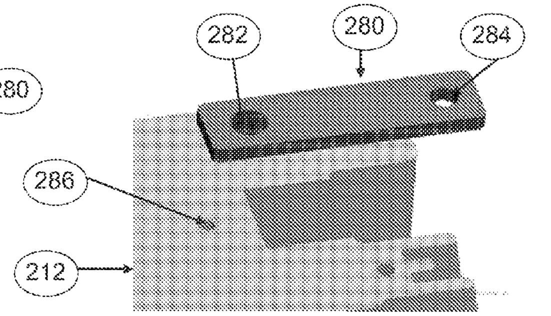
FIGURE 21c

SEALED CIRCUIT BREAKER

RELATED APPLICATION

This application claims priority to Indian Application Serial No. 2321/MUM/2010, filed Aug. 18, 2010 and PCT/US11/48114 filed Aug. 17, 2011 the disclosures of which are hereby incorporated by reference.

FIELD OF THE INVENTION

This application relates generally to sealed electrical enclosures for use in hazardous locations for a variety of electrical components, such as circuit breakers, motor switches, GFI devices, and photocells.

BACKGROUND OF THE INVENTION

Traditionally, in Europe, in accordance with IEC methodology, each circuit breaker or other electrical device is separately and permanently sealed (often potted in epoxy) to provide a flame proof device. Such circuit breakers are available from Stahl, CEAG, and ATX. Each flame proof sealed circuit breaker or electrical device is then typically placed in a non-metallic or sheet metal enclosure. In the event that a circuit breaker needs to be replaced, the flame proof circuit breaker is removed, and a replacement flame proof circuit breaker installed. A drawback to this methodology is that it is more costly to replace each separately sealed flame proof circuit breakers than it is to replace non-flame proof circuit breakers.

Alternatively, in North America, to use circuit breakers in a hazardous (classified) area, standard circuit breakers are placed in a cast metal housing such as aluminum, wherein the cast metal housing is bolted shut. In such an arrangement, the circuit breaker switches may be manipulated through a cast metal door that is bolted to the cast metal housing. In North America, this construction is suitable for Class I Division 1 and Class I Division 2 applications. A drawback of this arrangement is that the cast iron enclosures are heavy and cumbersome. Furthermore, it can be time consuming and laborious to remove the often extensive number of bolts from the cast metal housing to access the circuit breakers within. Thus, replacing circuit breakers using enclosures with this construction can be time consuming and costly.

There has been an increased demand for sealed breakers in North America and around the world. Thus, there is a need to provide an electrical enclosure for use in hazardous (classified) locations that can provide for the removal and replacement of circuit breakers or other electrical components from a reusable electrical enclosure. One response to this need is set forth in pending U.S. patent application Ser. No. 12/283,053 filed on Sep. 9, 2008 and herein incorporated by reference in its entirety. Another response to this need is set forth in pending Indian Patent Application No. 864/MUM/2010 filed on Mar. 26, 2010 and herein incorporated by reference in its entirety. The present application includes additional embodiments and/or improvements to the inventions set forth in U.S. patent application Ser. No. 12/283,053 and/or Indian Patent Application No. 864/MUM/2010.

SUMMARY OF THE INVENTION

The present application provides a sealed electrical enclosure for use in hazardous locations for enclosing circuit breakers or other electrical components comprising a bottom housing and a top housing positioned thereabove; a labyrinth joint or serrated joint being formed between the bottom housing and the top housing; the bottom housing adapted to receive a plurality of circuit breakers or other electrical components; and a first metal bus extending from a point internal to the bottom housing through a first end wall to a point external to the bottom housing; and a second metal bus extending from a point internal to the bottom housing through a second end wall to a point external to the bottom housing; where the first metal bus and the second metal bus are adapted to contact first and second electrical terminals of a first circuit breaker placed within the bottom housing; and a first actuating mechanism positioned on the top housing adapted for manipulating one or more switches of circuit breakers or electrical components positioned within the bottom housing; a first lug retaining bracket secured to the bottom housing and extending to a position beneath the first metal bus; wherein the distance between the end of the lug retaining bracket and the bottom of the first metal bus is such that a bottom portion of a connector assembly may fit within the space between the end of the lug retaining bracket and the bottom of the first metal; and wherein the top housing is removably secured to the bottom housing to allow for removal and replacement of circuit breakers or other electrical components within the housing.

BRIEF DESCRIPTION OF ACCOMPANYING DRAWINGS

Exemplary embodiments of the invention are described herein with reference to the drawings, in which:

FIG. 7 is a top perspective view of the bottom housing of the sealed electrical enclosure of FIG. 1;

FIG. 8 is a close up view of a portion of the bottom housing of FIG. 7;

FIG. 9 is a top perspective view of the top housing of the sealed electrical enclosure of FIG. 1;

FIG. 10 is a partial cut-away view of a sealed electrical enclosure;

FIG. 11 is a cut-away view of a portion of the actuating mechanism of the sealed electrical enclosure of FIG. 1;

FIG. 19*a* is a perspective view of the top housing and bottom housing of a sealed electrical enclosure;

FIG. 19*b* is cutaway view of top housing positioned on the bottom housing, detailing the method of joining by using metal inserts, O-rings and screws;

FIG. 19*c* is close up view of the metal insert, O-ring and screws, used for joining the top housing and bottom housing shown in FIG. 19*b;*

Figure 20A:
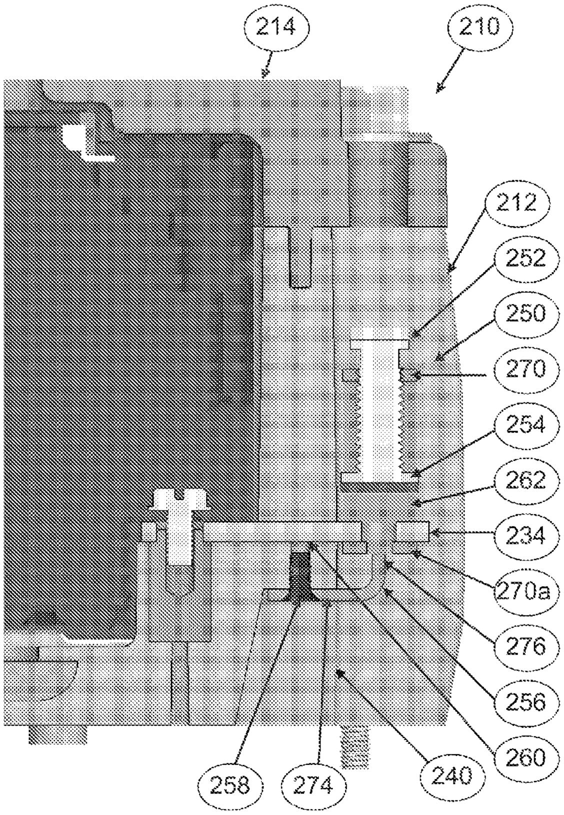
Figure 20B:
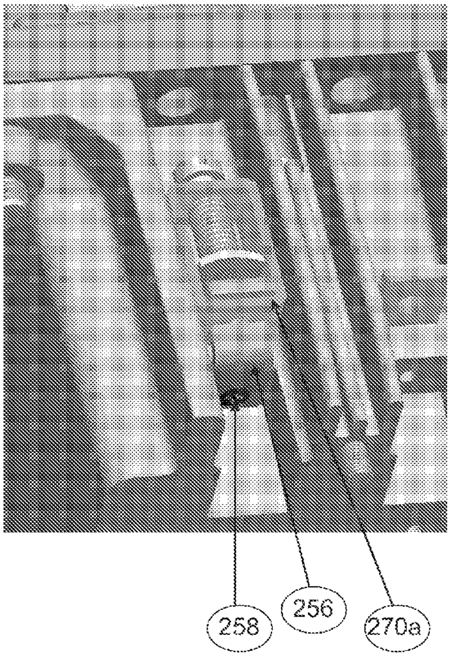

FIG. 20*a* is a cutaway view of an embodiment of a sealed electrical enclosure;

FIG. 20*b* is a perspective view of the embodiment of FIG. 20*a;*

FIG. 21*a* is top view of an embodiment of a sealed electrical enclosure;

FIG. 21*b* is a perspective view of the embodiment shown in FIG. 21*a*; and FIG. 21*c* is a close up view of the mounting bracket shown in FIGS. 21*a* and 21*b;*

Figure 22:
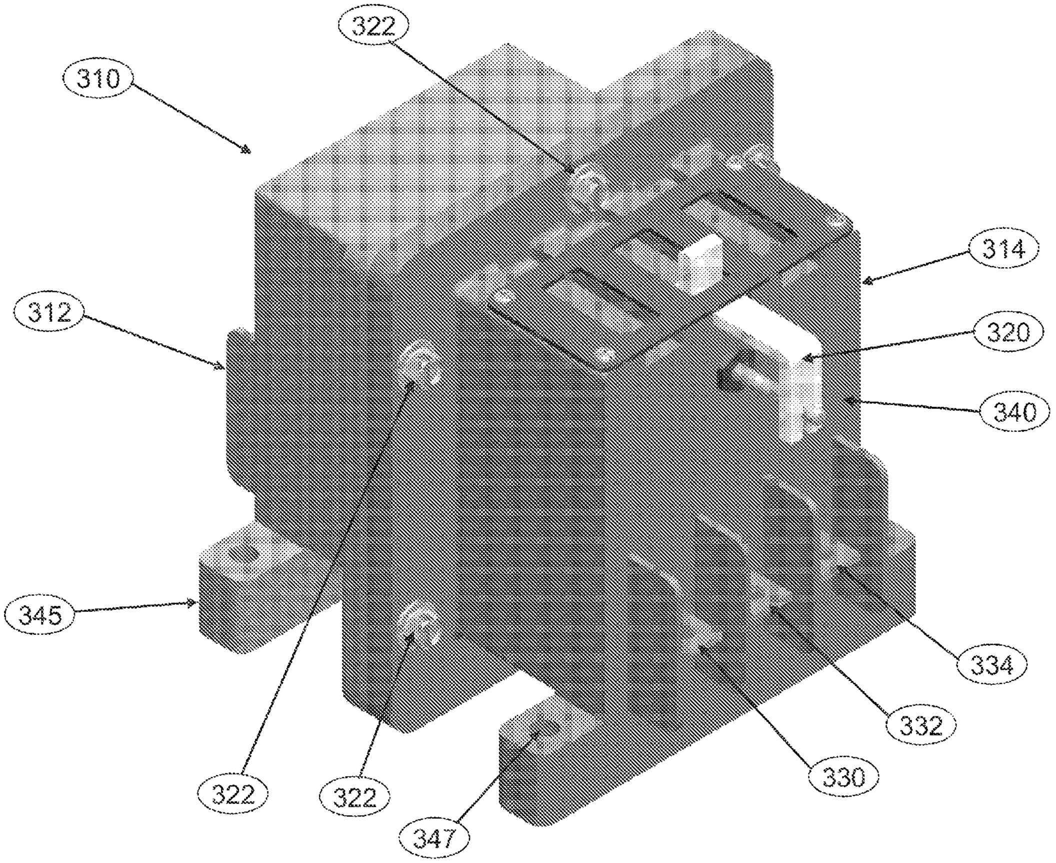
Figure 23:
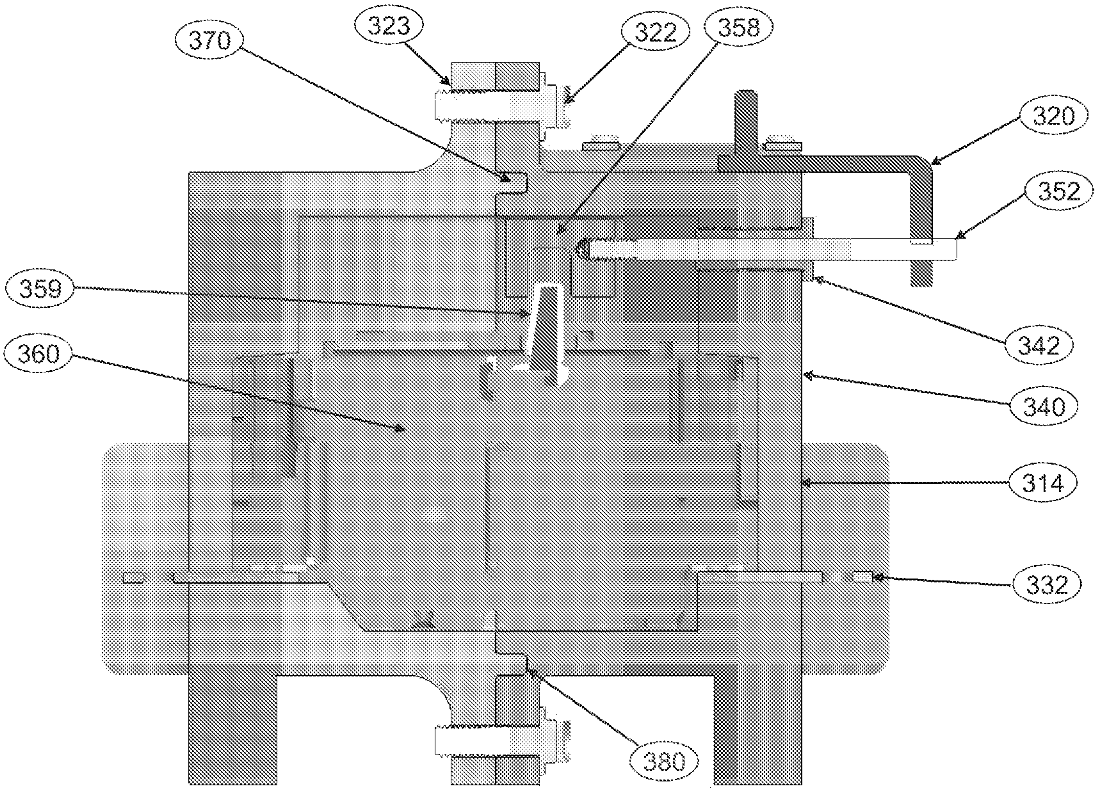
Figure 24:
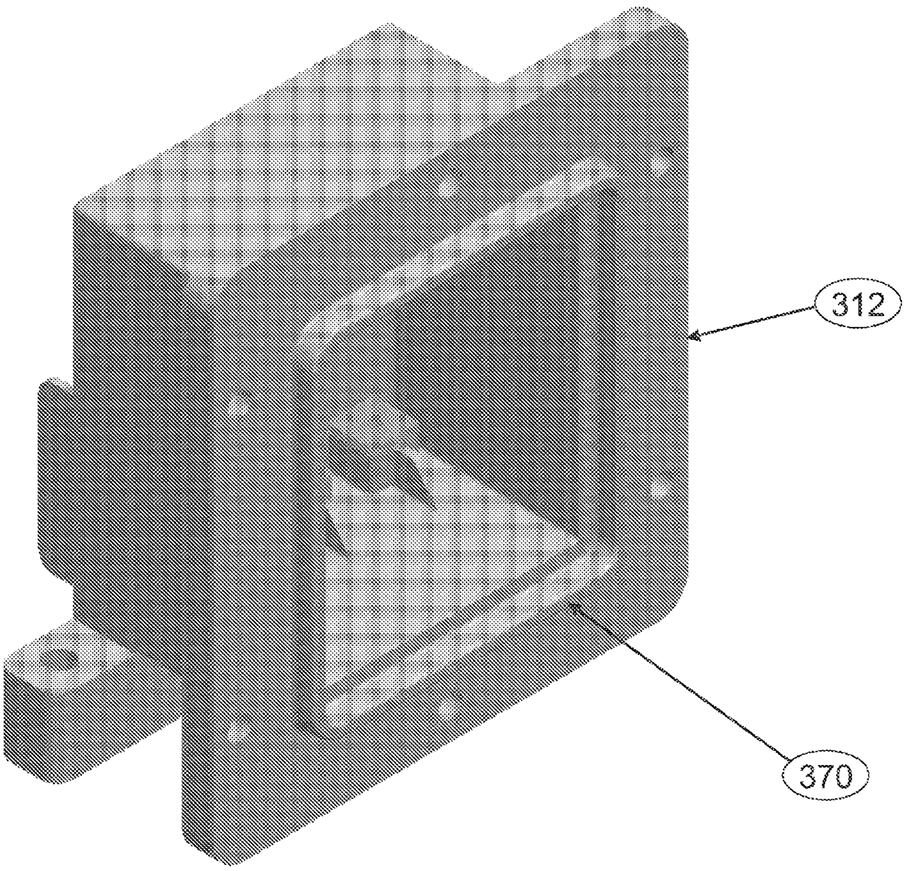
Figure 25:
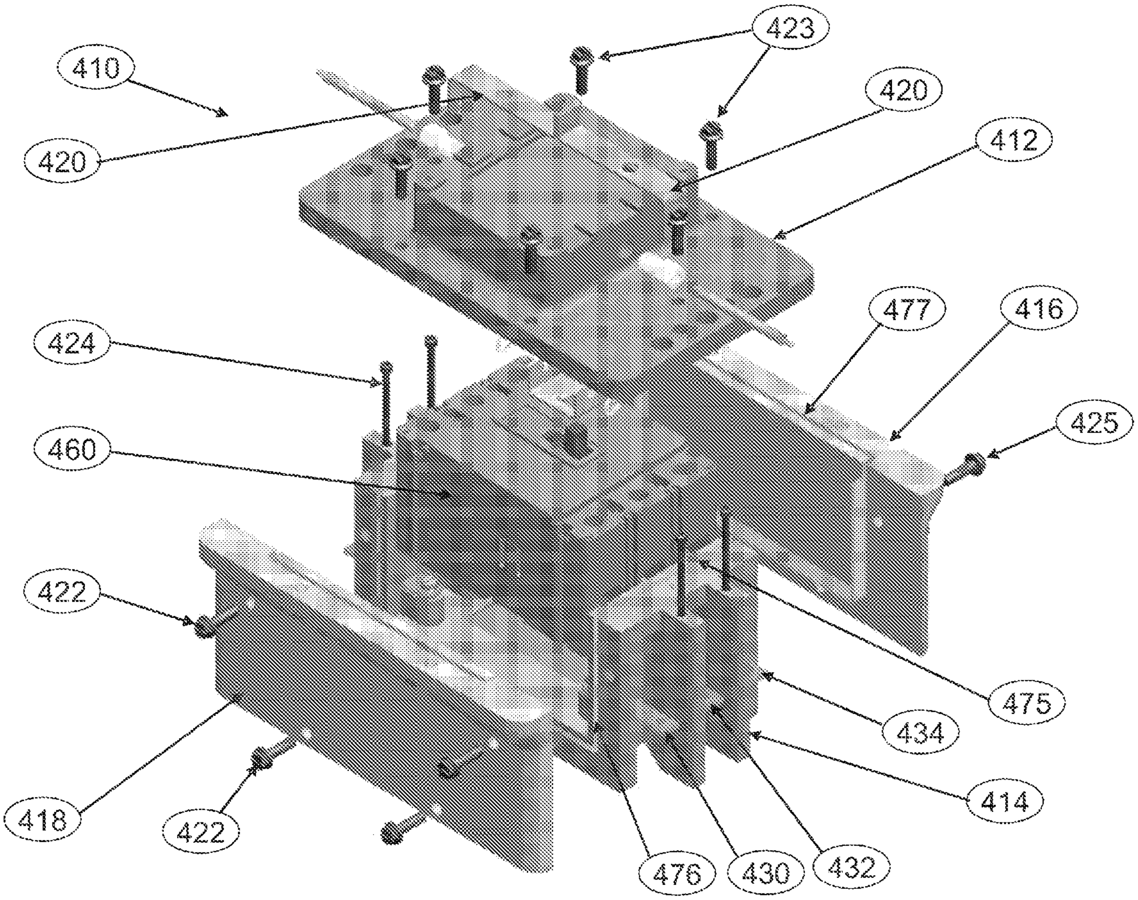
Figure 26B:
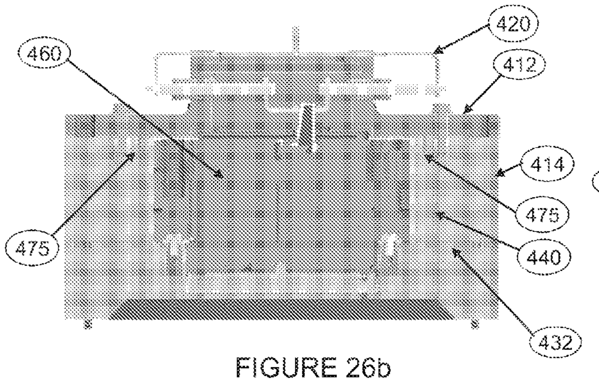
Figure 26A:
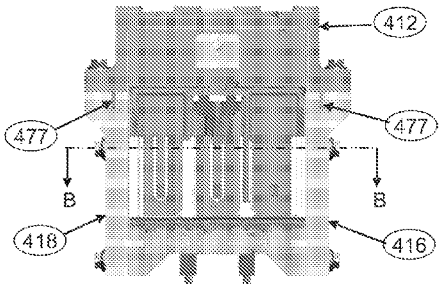
Figure 26C:
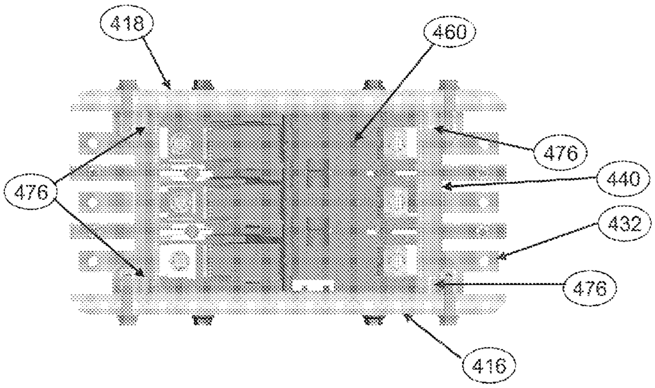

FIG. 22 is a perspective view of a sealed electrical enclosure;

FIG. 23 is a cutaway view of the sealed electrical enclosure of FIG. 22;

FIG. 24 is a perspective view of a first housing used in the sealed electrical enclosure of FIG. 22;

FIG. 25 is an exploded view of an alternate construction for a sealed electrical enclosure;

FIG. 26*a* is a cutaway side view of the sealed electrical enclosure of FIG. 25;

FIG. 26*b* is a cutaway end view of the sealed electrical enclosure of FIG. 25;

FIG. 26*c* is a cutaway top view of the sealed electrical enclosure of FIG. 25.

DESCRIPTION OF THE INVENTION

The invention will now be described with reference to the embodiments shown in the accompanying drawings. The embodiments do not limit the scope and ambit of the invention. The description relates purely to the exemplary preferred embodiments of the invention and its suggested application.

Figure 1:
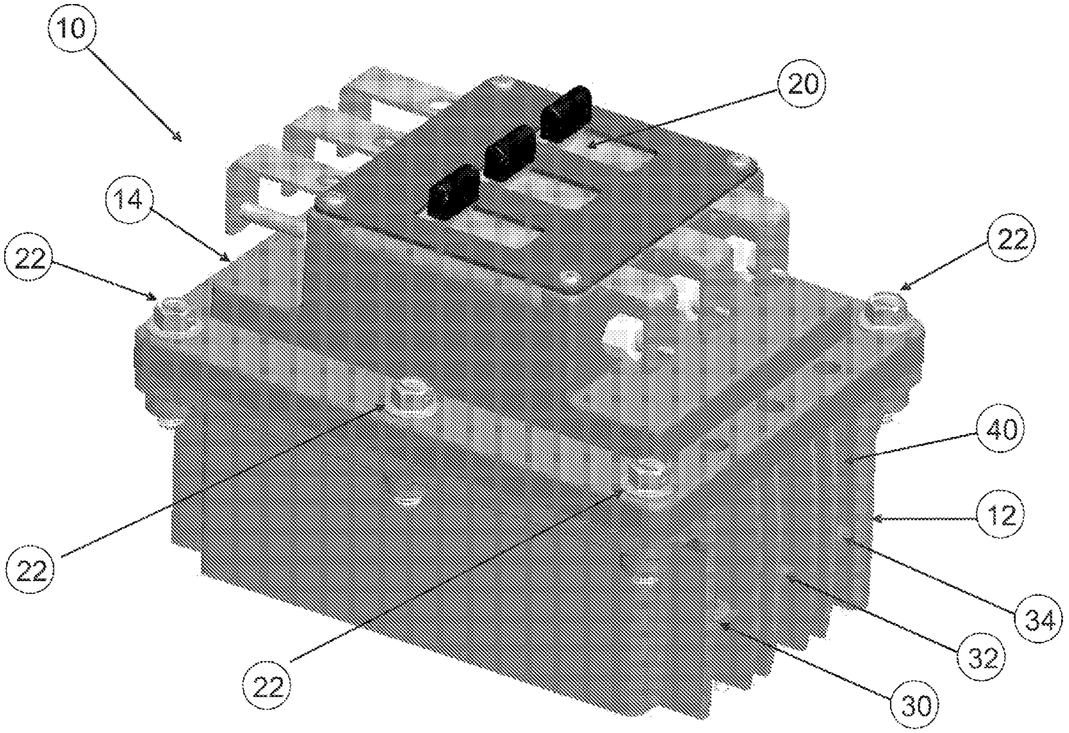
FIG. 1 is a perspective view of an embodiment of a sealed electrical enclosure.

Referring to FIG. 1, a perspective view of sealed electrical enclosure 10 is shown having bottom housing 12 and top housing 14, with top housing 14 being removably secured to bottom housing 12 using bolts 22. In the embodiment shown in FIG. 1, the bolts 22 pass through the top housing and threads on the bolts 22 screw directly into the bottom housing 12. Of course, it is not required to use bolts, but any other suitable means of removably securing top housing 14 to bottom housing 12 could be used such as clips, screws, clamps, latches, etc. Preferably bottom housing 12 and top housing 14 are comprised of hard non-conductive material such as a plastic or composite material, most preferably Solvay IXEF 1022, Ryton R-4, or IXEF 1521.

Sealed electrical enclosure 10 further includes an actuating mechanism 20 that allows for the manipulation of the switches of circuit breakers or other electrical components positioned within the enclosure 10. The actuating mechanism 20 provides for linear actuation, although rotary actuation could be used as well. Enclosure 10 may be used to house various types of circuit breakers and other electrical components such as circuit interrupters, motor switches, GFI devices, and photocells to name a few. Further, enclosure 10 may be used to house both IEC and NEC approved products.

As shown in FIG. 1, electrical buses 30, 32, and 34 extend from a point within the enclosure 10 through a first sidewall 40 to a point external to the enclosure 10 as shown. In this manner, circuit breakers or other electrical products may be positioned entirely within enclosure 10 and electrically connected to electrical terminals in an electrical panel box (not shown). Using the configuration shown, sealed enclosure 10 provides for a flame proof housing for use in Class I, Division 2 applications, and in hazardous locations or areas classified by divisions or zones such as Class I, Zone 1.

With the configuration of sealed electrical enclosure 10, by removing bolts 22, top housing 14 may be removed from bottom housing 12. As a result, the circuit breakers or other electrical products positioned within the enclosure 10 may be removed and replaced, while allowing sealed electrical enclosure 10 to be reused.

Figure 2:
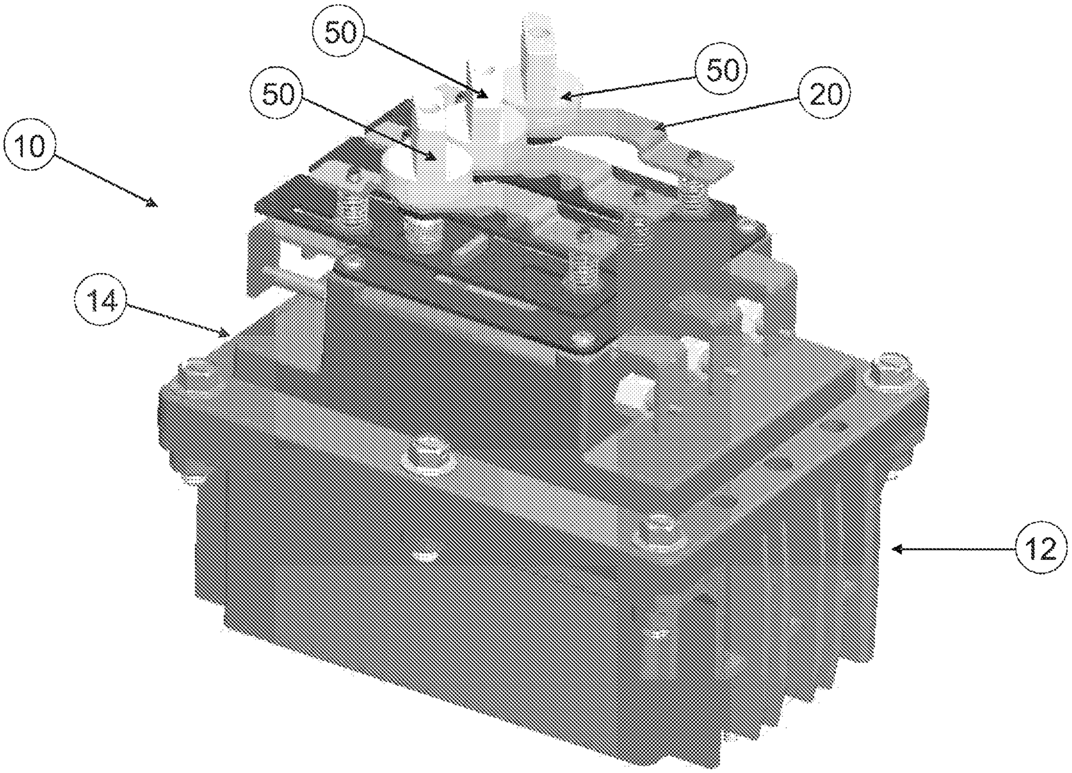
FIG. 2 is a perspective view of an embodiment of the sealed electrical enclosure of FIG. 1 adapted for operation externally from an electrical panel box.

FIG. 2 discloses sealed electrical enclosure 10, with external actuating mechanism 20 further including knobs or extensions 50 that allow the enclosure 10 to be positioned within an electrical panel box (not shown), and still allow for the actuating mechanism to manipulate the switch of a circuit breaker or other electrical device positioned within enclosure 10.

Figure 3:
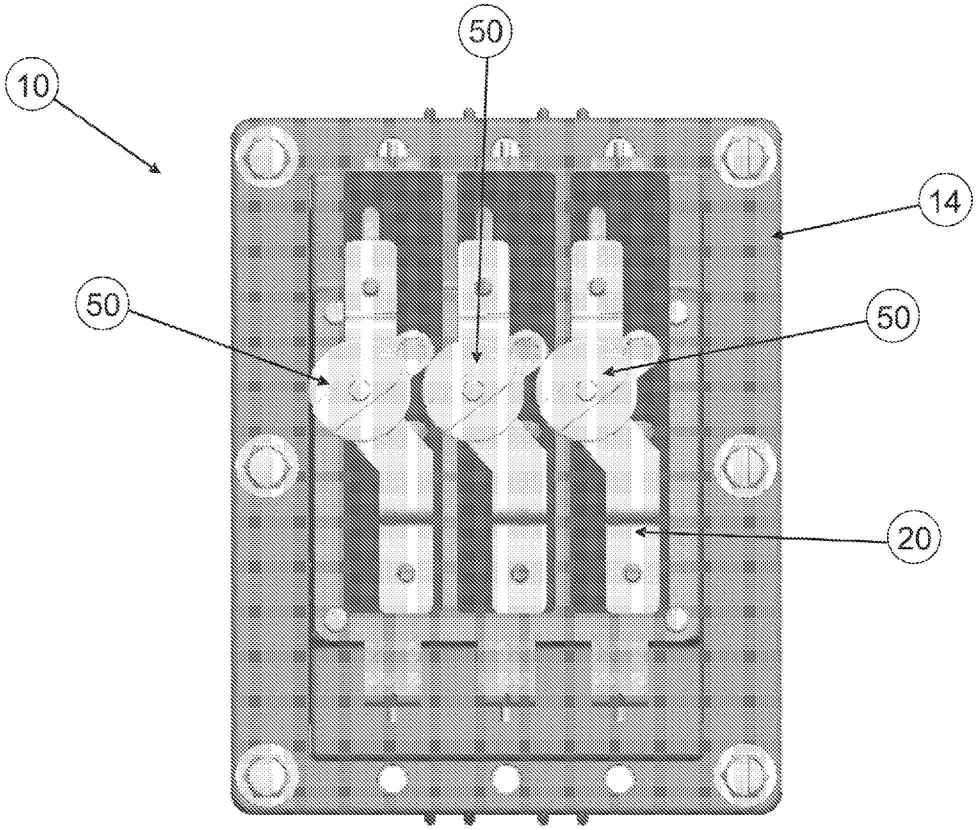
FIG. 3 is a top view of the sealed electrical enclosure of FIG. 2.

FIG. 3 is a top view of the enclosure 10 shown in FIG. 2 showing another view of knobs or extensions 50 positioned on top housing 14.

Figure 4:
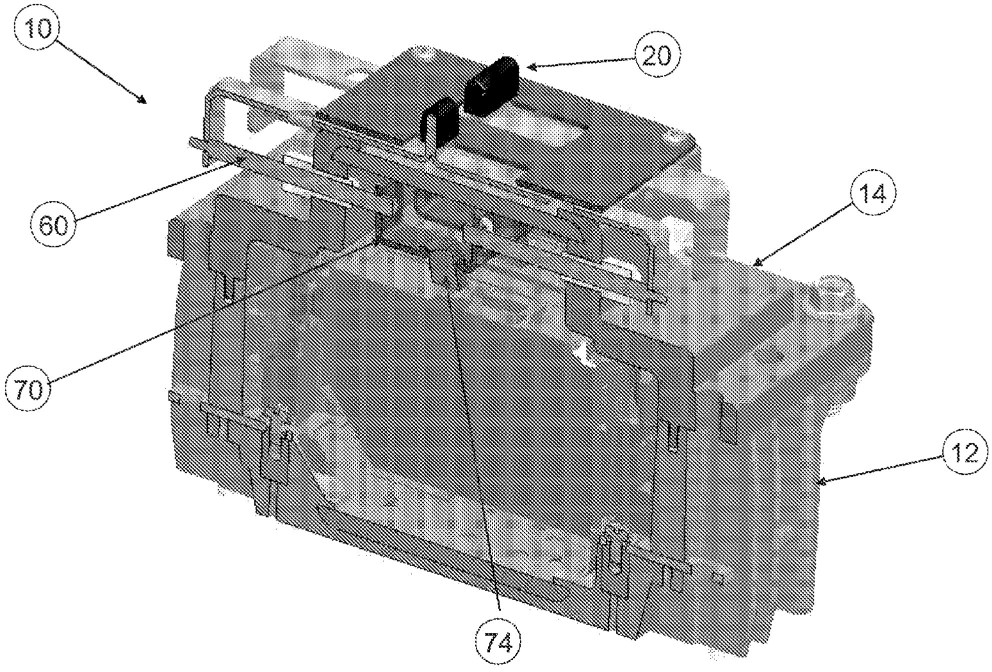
FIG. 4 is a perspective cut-away view of the sealed electrical enclosure of FIG. 1.

FIG. 4 shows a sectional, perspective view of sealed electrical enclosure 10 with actuating mechanism 20 on top housing 14 including a slidable rigid rod 60 as well as a switch manipulator 70 attached thereto for manipulating switch 74 of a circuit breaker or other electrical device.

Figure 5:
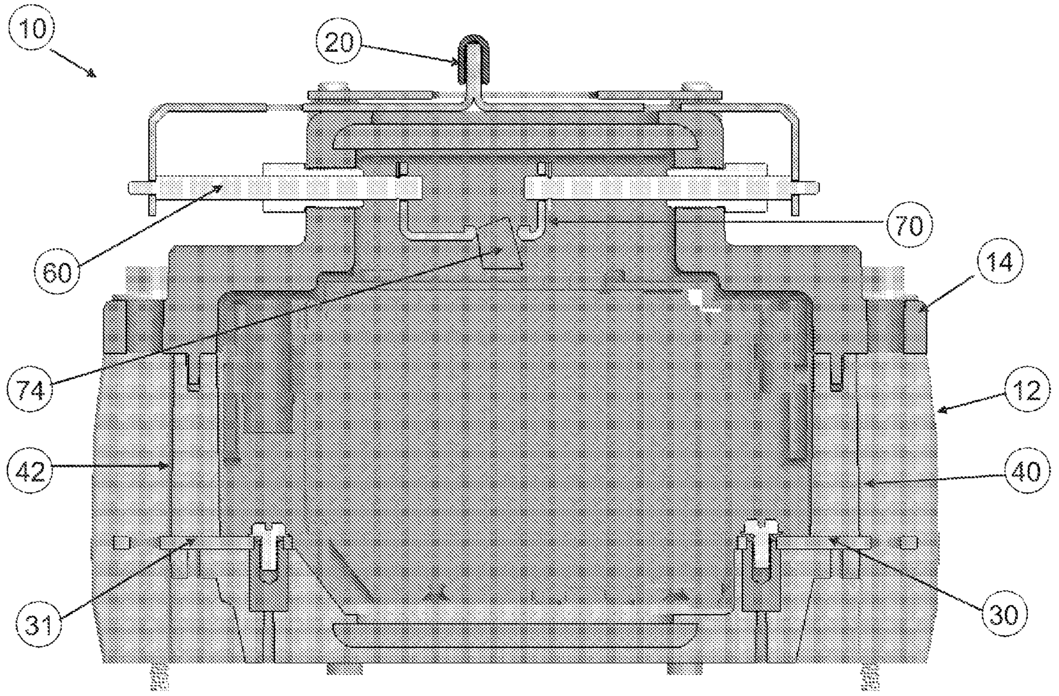
FIG. 5 is a sectional view of the sealed electrical enclosure of FIG. 1.

FIG. 5 shows a side sectional view of enclosure 10 and provides another view of actuating mechanism 20 including slidable rigid rod 60 that may be moved in a slidable manner within top housing 14, as well as switch manipulator 70 attached thereto for manipulating switch 74. FIG. 5 also shows electrical bus 30 extending from a point within bottom housing 12 through a first sidewall 40 of bottom housing 12 to a point external to enclosure 10. Similarly, electrical bus 31 is shown extending from a point within bottom housing 12 through second sidewall 42 of bottom housing 12 to a point external to enclosure 10. This configuration having electrical buses 30 and 31 extending through the first and second sidewalls 40 and 42 respectively allows a circuit breaker to be positioned within the enclosure 10 with a first electrical terminal of the circuit breaker contacting bus 30 inside of the bottom housing 12 and a second electrical terminal of the circuit breaker contacting bus 31 inside of the bottom housing 12 and thereby providing an electrical connection via bus 30 and 31 to a point external of enclosure 10 to allow further electrical connection to electric terminals within an electrical panel box.

This configuration allows for the circuit breakers to be completely enclosed with the enclosure 10, but provides for electrical connection of the circuit breaker to other electrical terminals external to the box. In this manner, the enclosure 10 provides a flame proof enclosure for use in hazardous (classified) areas with the manipulation of the switch 74 external to the enclosure. With such a design, the circuit breakers within the enclosure 10 do not themselves need to be flame proof and can be more easily removed and replaced simply by removing top housing 14 while allowing sealed enclosure 10 to be reused.

With respect to FIGS. 1 and 5, buses 30-35 are preferably positioned within their respective sidewalls by a molding process. One method of molding the buses into the sidewalls is by placing the buses into the mold before the molten plastic fills the mold. The electrical buses 30-35 may be comprised of a copper strip with nickel plating.

Figure 6:
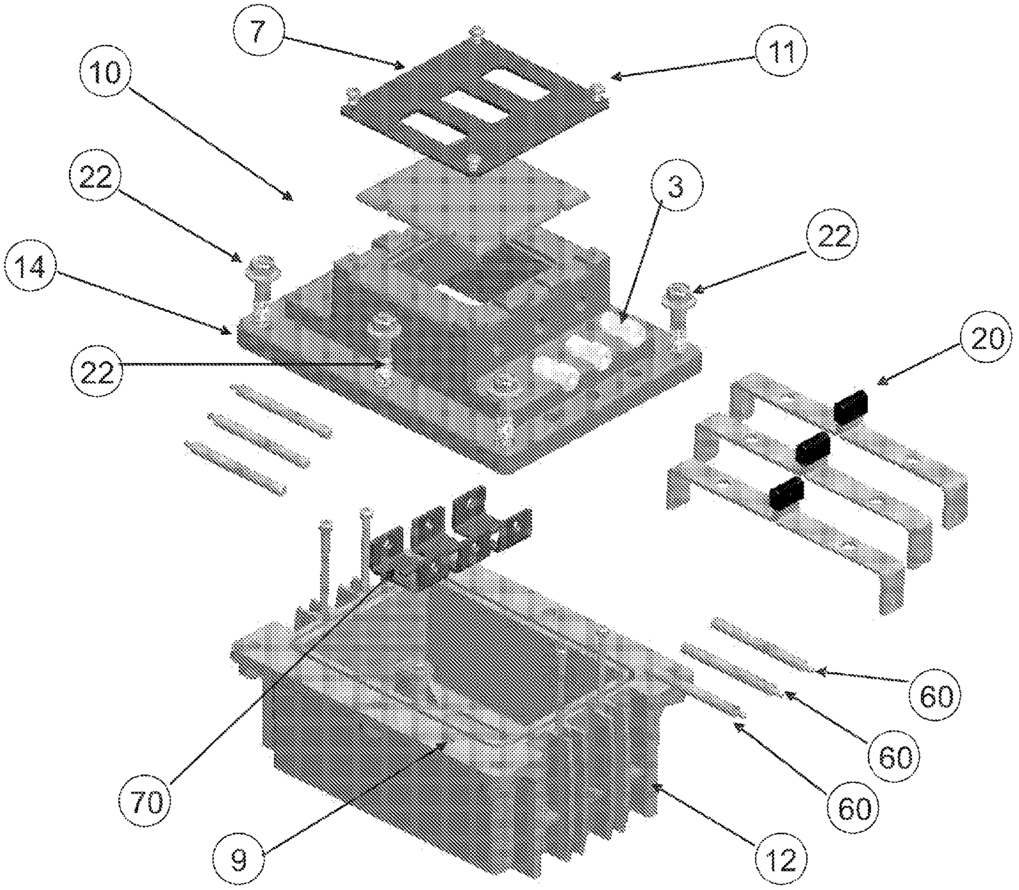
FIG. 6 is an exploded view of a sealed electrical enclosure.

FIG. 6 shows an exploded view of sealed enclosure 10. In this embodiment, there are shown three separate actuating mechanisms 20 each using a slidable rigid rod 60 with bolts 22 shown on top housing 14. It should be noted that while slidable rigid rod 60 is preferably of a round cross-section, it could also have a square, hexagonal, oval or other cross-section. Thus, the term "rod" is not limited to a rod having a round cross-section, but encompasses any other suitable geometry as well.

FIG. 7 shows a perspective view of bottom housing 12, showing electrical buses 30, 32, and 34 extending through first sidewall 40 from a point within the bottom housing 12. FIG. 7 further shows buses 31, 33, and 35 positioned within bottom housing 12 into (and through) second sidewall 42 to a point external to the enclosure 10. Bottom housing 12 also includes labyrinth channel 80 that is adapted to receive a corresponding labyrinth extension of the top housing 14 (not shown) to form a labyrinth seal or joint, or flame path. A serrated joint could also be used, or a combination of serrated joint and a labyrinth joint. Also shown in a bottom wall of bottom housing 12 is a venting plate or vent 82 that allows for pressure and heat to dissipate within the enclosure. Vent 82 is preferably formed of a sintered bronze material. Other materials could be used as the vent material such as stainless steel or aluminum.

FIG. 8 shows a close up view of a portion of bottom housing 12 more clearly showing labyrinth channel 80.

FIG. 9 shows a perspective view of top housing 14 and shows a venting plate or 84 vent positioned on the top thereof. Similar to venting plate 82 shown in FIG. 7, vent 84 allows for pressure and heat to dissipate within the enclosure. Vent 84 is also preferably formed of a sintered bronze material.

FIG. 10 is a partial cut-away view of sealed electrical enclosure 10 showing knobs or extensions 50 positioned on actuating mechanism 20. In this Figure, switch manipulator 70 is shown connected to slidable rigid rod 60 for manipulating switch 74 of a circuit breaker or other electrical component.

FIG. 11 shows a close up view of slidable rigid rod 60 that slidably extends through bushing 62 that is threadably connected to actuating mechanism 20. Preferably, there is a very close tolerance between rod 60 and bushing 62 to eliminate any flame path from within the enclosure 10. Preferably a 0.002 maximum clearance is used.

Figure 12:
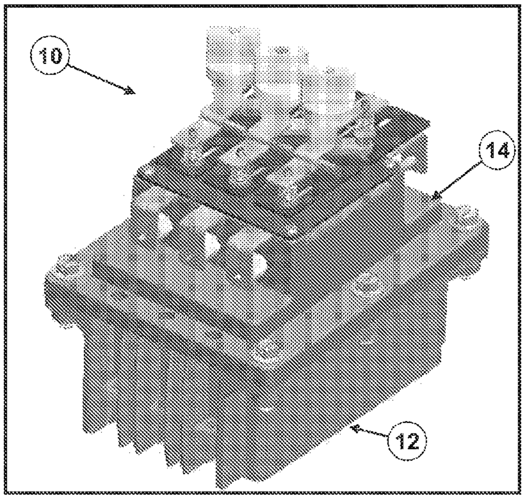
FIG. 12 is a perspective view of a sealed electrical enclosure.
Figure 13:
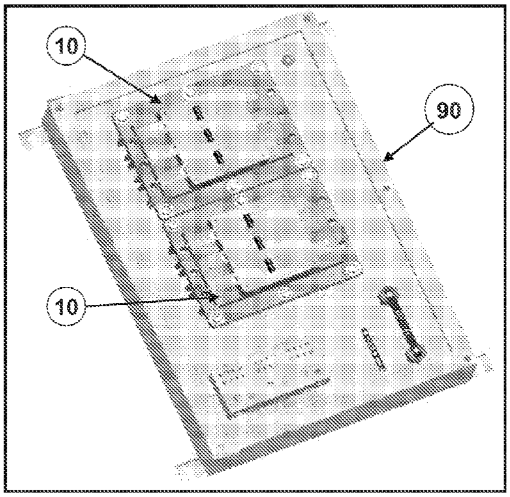
FIG. 13 is a perspective view of two sealed electrical enclosures positioned within an electrical panel box.

FIG. 12 shows a perspective view of sealed electrical enclosure 10 with bottom housing 12 and top housing 14 and FIG. 13 shows electrical panel box 90 with two sealed enclosures 10 positioned therein.

Figure 14:
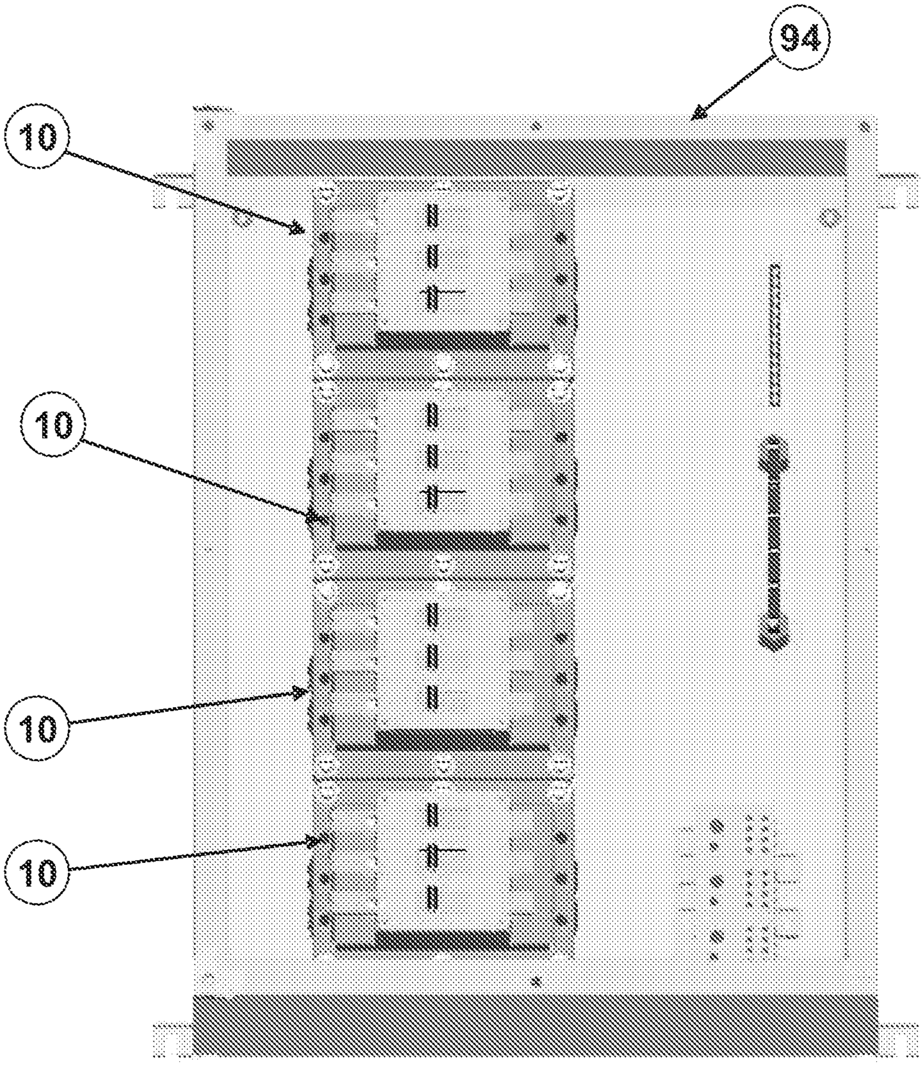
FIG. 14 is a perspective view of four sealed electrical enclosures positioned within an electrical panel box.

FIG. 14 shows four sealed enclosures 10 alternately positioned within an electrical panel box 94.

Figure 15:
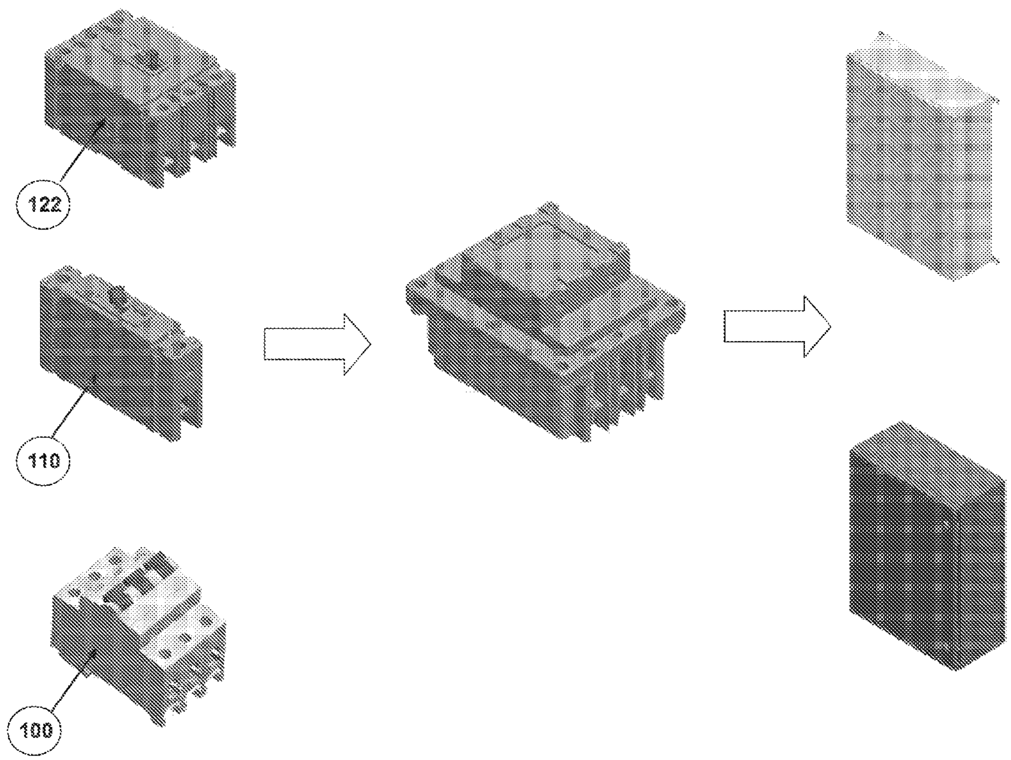
FIG. 15 is a perspective view of various circuit breakers that may be positioned within the sealed electrical enclosure of FIG. 1.

FIG. 15 shows various circuit breakers or electrical devices that may be positioned within the enclosure 10. Numeral 110 refers to a one-pole NEC circuit breaker design, while numeral 122 refers to a three-pole NEC circuit breaker design. Numeral 100 references IEC circuit breakers or interrupters that also may be positioned within enclosure 10. Of course, many other kinds of circuit breakers could be used with this enclosure, including two pole designs.

The present invention is shown in a particular configuration for illustrative purposes only. The enclosure 10 may have varying geometries to accommodate various sized circuit breakers and electrical components. It is contemplated that the enclosure 10 may be used with all of the F-Series or F-frame circuit breaker skus currently available from Cutler-Hammer, ranging up to 225 amps, and covering 1, 2, and 3 pole versions. It is also contemplated that the enclosure 10 may be used with all of the QC Series circuit breaker skus currently available from Cutler-Hammer, ranging up to 100 amps, and covering 1, 2, and 3 pole versions. With some possible modification to the geometry of the housing, it is contemplated that the present design would be suitable for use for many different types of available or yet to be released circuit breakers.

Figure 16:
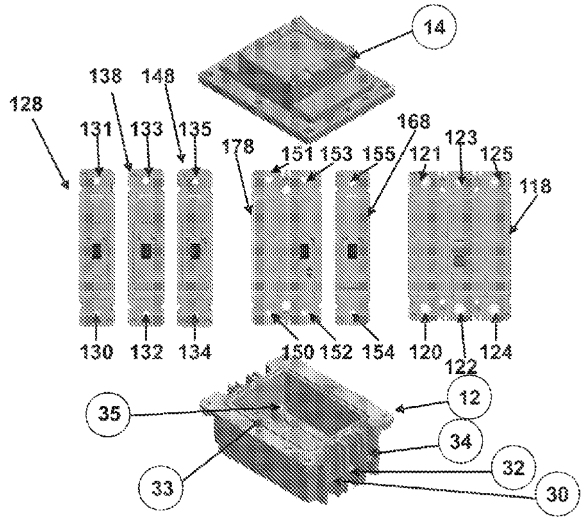
FIG. 16 is a perspective view of various types of circuit breakers that may be positioned within the sealed electrical enclosure of FIG. 1.

FIG. 16 discloses bottom housing 12 along with various circuit breakers 118, 128, 138, 148, 168, and 178 that may be positioned within bottom housing 12. For example, circuit breaker 118 is of a 3 pole variety having a single switch. When circuit breaker 118 is properly positioned within bottom housing 12, electrical terminal 124 of the circuit breaker 118 contacts bus 34 within the bottom housing 12, electrical terminal 122 contacts bus 32 within the bottom housing 12, and electrical terminal 120 contacts bus 30 within the bottom housing 12. Similarly, electrical terminal 125 of circuit breaker 118 contacts bus 35 within the bottom housing 12, electrical terminal 123 contacts bus 33 within the bottom housing 12, and electrical terminal 121 contacts bus 31 (not shown) within the bottom housing 12. In this manner, the enclosure 10 may accommodate a 3 pole circuit breaker having a single switch.

FIG. 16 also discloses that more than one circuit breaker may be accommodated. For example, circuit breakers 128, 138, and 148, all of a 1 pole one switch variety may all be positioned within the bottom housing 12. Circuit breaker 148 may be properly positioned within bottom housing 12 so that electrical terminal 134 of the circuit breaker 148 contacts bus 34 within the bottom housing 12 and electrical terminal 135 contacts bus 35 within the bottom housing 12. Similarly, circuit breaker 138 may be properly positioned within bottom housing 12 next to circuit breaker 148 so that electrical terminal 132 of the circuit breaker 138 contacts bus 32 within the bottom housing 12 and electrical terminal 133 contacts bus 33 within the bottom housing 12. Additionally, circuit breaker 128 may be properly positioned within bottom housing 12 next to circuit breaker 138 so that electrical terminal 130 of the circuit breaker 128 contacts bus 30 within the bottom housing 12 and electrical terminal 131 contacts bus 31 (not shown) within the bottom housing 12. In this manner, the enclosure may accommodate three separate circuit breakers, in this case each being of the one pole, one switch variety.

FIG. 16 further discloses that the sealed enclosure may accommodate circuit breakers of varying types and dimensions. For example, circuit breaker 168, a single pole single switch type, may be positioned within the bottom housing 12 so that electrical terminal 154 of the circuit breaker 168 contacts bus 34 within the bottom housing 12 and electrical terminal 155 contacts bus 35 within the bottom housing 12. Additionally, circuit breaker 178, a 2 pole, single switch type, may be properly positioned within bottom housing 12 next to circuit breaker 168 so that electrical terminal 152 of the circuit breaker 178 contacts bus 32 within the bottom housing 12 and electrical terminal 153 contacts bus 33 within the bottom housing 12, while electrical terminal 150 contacts bus 30 within the bottom housing 12 and electrical terminal 151 contacts bus 31 (not shown) within the bottom housing 12. In this manner, the enclosure may accommodate two different circuit breakers of different geometries and design.

It will be appreciated that the enclosure could be enlarged to house additional circuit breakers and its geometry could be modified to accommodate circuit breakers of varying size.

The sealed enclosure described herein may be used in hazardous (classified) locations including Class I, Division 2 and Class I, Zone 1 environments, and it is believed that it is arc flash proof as well.

Figure 17:
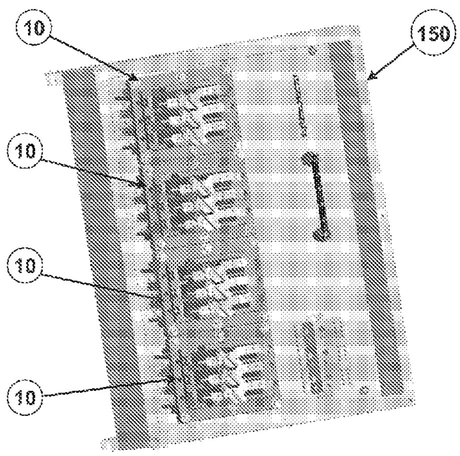
FIG. 17 is a perspective view of four sealed electrical enclosures positioned on an electrical panel.

FIG. 17 discloses four sealed electrical enclosures 10 mounted on an electrical panel 150. It is contemplated that enclosures 10 may be mounted in suitable electrical panel boxes, including stainless steel, plastic, and thin-wall cast panel boxes.

Figure 18:
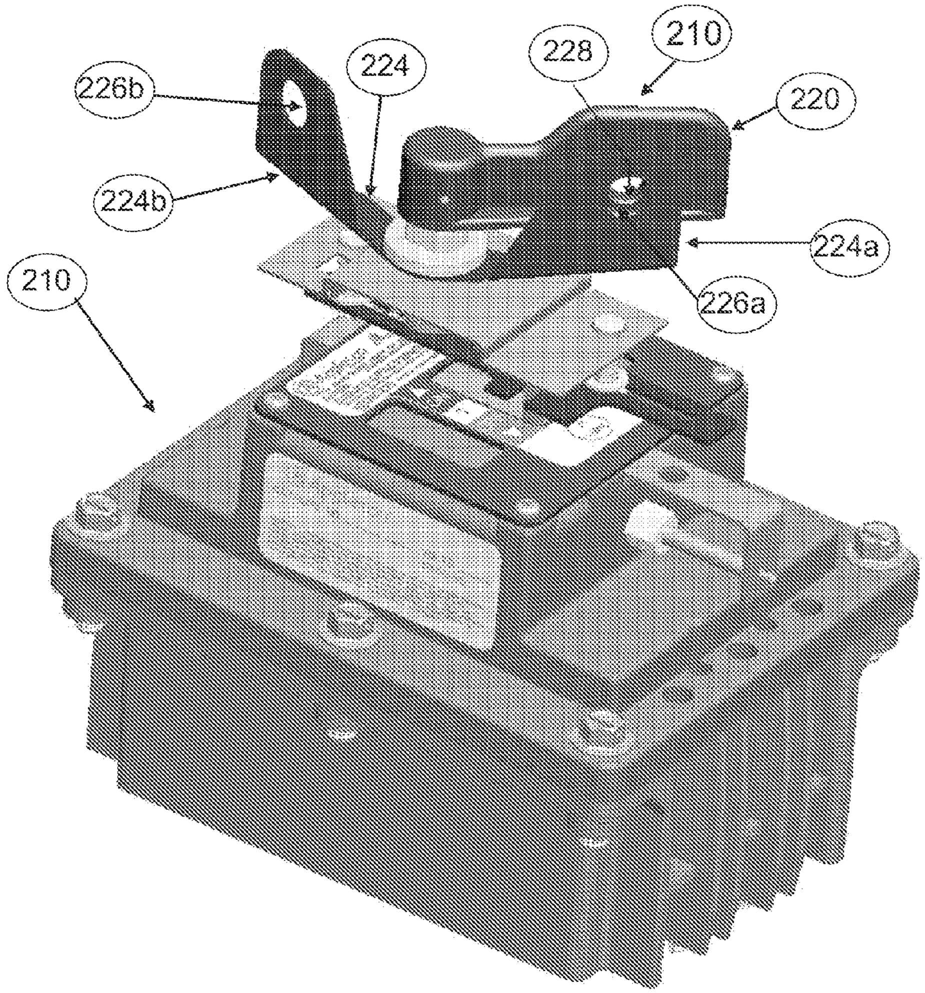
FIG. 18 is a perspective view of an alternate embodiment of a sealed electrical enclosure.

FIG. 18 discloses sealed enclosure 210 with an actuating mechanism 210 having a handle 220 rotatable from a first position (as shown) adjacent to upright flange 224*a* of locking flange 224 to a second position adjacent to upright flange 224*b* of locking flange 224. Upright flange 224*a* includes a locking throughhole 226*a* that is positioned in alignment with a locking throughhole 228 positioned in handle 220 when the handle is in its first position. In this manner, a lock or other securing device may be placed through throughholes 228 and 226*a* to lock the handle 220 in its first position. With this design, the handle 220 may be locked from movement in its first position, if desired. In addition, when the handle is positioned in its second position, upright flange 224*b* includes a through hole 226*b* that is positioned in alignment with the locking throughhole 228 positioned in the handle 220 when the handle 220 is positioned in its second position. In this manner, a lock or other securing device may be placed through throughholes 228 and 226*b* to lock the handle 220 in its second position. With this design, the handle 220 may be locked from movement in its first position, if desired.

Preferably the handle 220 is moveable through an angle greater than 90 degrees when moved from its first position to a second position. Preferably the angle of movement of handle 220 extends between 90 degrees and 180 degrees, and most preferably through an angle of between 135 and 145 degrees.

FIG. 19*a* discloses sealed breaker housing 210 having a top housing 214 and a bottom housing 212. Top housing 214 has three throughholes 230 extending through a top surface of a first side of top housing 214 and an additional three throughholes 230 extending through a top surface of a second side of top housing 214. The throughholes 230 are positioned such that they are in alignment with corresponding screw receptables 232 positioned generally on the top of bottom housing 212 when the top housing 214 is positioned on top of bottom housing 212. As can be seen in FIG. 19*b* and FIG. 19*c*, to further strengthen the connection between the top housing 214 and the bottom housing 212, each of the screw receptables 232 includes a metal insert 233*b* into which a screw 233 passing through the throughholes 230 may be inserted. The metal inserts 233*b* include internal threads adapted to mate with respective screws 233 inserted through throughholes 230. The metal inserts are preferably press fitted into position into screw receptables 232. Alternatively, they could be externally threaded and threaded into screw receptables 232. The metal inserts, preferably made up of brass material, are preferably metric inserts having a M8×1.25 pitch and preferably having 10 metric internal threads and preferably an outer diameter of 0.390 inches (or 9.89 mm) when used on sealed breaker housings designed to house F Frame series breakers. The use of metal inserts is believed to reduce stress and/or stress concentrations on the bottom housing and provide for a more secure connection. In addition, O-rings 233*a* that may be pre-assembled on the shank of screw can be used, making it similar to captive screw functioning. In other words, the O-rings serve to the screws to fall from the top housing when the sealed housing is not in its assembled condition. By using O-ring 233*a* or any similar part, the screw 233 will always remain assembled with cover, unless the screw 233 is forcefully removed from the top housing.

FIG. 20*a* shows a cutaway view of sealed breaker housing 210 and FIG. 20*b* shows a perspective view of sealed breaker housing 210. As shown in FIGS. 20*a* and 20*b*, electrical bus 234 extends through sidewall 240 where it is adapted for connection to electrical connector assembly 250 having a screw 252 attached to connector plate 254, and positioned within connector housing 270. Electrical connector assembly 250 is adapted to sandwich an electrical element (not shown) in space 262 between connector plate 254 and electrical bus 234. A lug retaining bracket 256 is positioned below electrical bus 234. The lug retaining bracket 256 is shown with a generally L-shaped cross section having a vertical flange 276 and a horizontal flange 274. The lug retaining bracket 256 is shown attached to a bottom portion of bottom housing 212 via threaded screw 258. Other methods of securing the flange to the bottom housing may also be used. A top end of vertical flange 276 is adapted to allow a bottom portion 270*a* of connector assembly 250 to be positioned between a bottom surface of electrical bus 234 and the top end of vertical flange 276. The use of lug retaining bracket 274 provides a means or mechanism for facilitating the placement and installment of connector assembly 250 and subsequent connection to an additional electrical element (not shown) in space 262. The connector assembly is thereby generally held in place while the technician is then free to tighten the screw 252 to wedge the additional electrical element (not shown) in space 262 between electrical bus 234 and connector plate 254 without having the connector assembly come loose or fall out during installation of the connector assembly 250 or the tightening process.

FIGS. 21*a*-21*c* disclose a sealed breaker housing 210 having external mounting brackets 280 to facilitate attachment of the sealed breaker housing 210 within an electrical panel, enclosure, or other desired location. In FIGS. 21*a* and 21*b*, four mounting brackets 280 are shown extending from sealed breaker housing 210. Each of the mounting brackets 280 includes a mounting hole 284 that allows for the passage of a bolt, screw or other attachment element to secure the sealed breaker housing 210 to a desired location. In FIG. 21*c*, mounting bracket 280 is shown having a mounting hole 284 for attachment to the inside of an electrical panel or enclosure, as well as a mounting hole 282 for mounting to the bottom of bottom housing 212. To mount the mounting bracket 280 to the bottom housing 212, a screw or bolt may be passed through mounting hole 282 into mounting hole 286 of bottom housing 212. The mounting brackets provide for easier installation of the sealed breaker housing 210 into an electrical panel or other desired location. Preferably, the mounting bracket is made of stainless steel.

FIGS. 22-24 disclose an alternative construction for the sealed electrical enclosure. Referring to FIG. 22, a perspective view of sealed electrical enclosure 310 is shown having first housing 312 and a second housing 314, with second housing 314 being removably secured to first housing 312 using screws 322. In the embodiment shown in FIG. 22, the screws 322 pass through the second housing and threads on the screws 322 screw directly into the first housing 312. Although this arrangement could be reversed with the screws 322 being screwed directly in the second housing 314. Of course, it is not required to use screws, but any other suitable means of removably securing second housing 314 to second housing 312 could be used such as clips, bolts, clamps, latches, etc. Preferably first housing 312 and second housing 314 are comprised of hard non-conductive material such as a plastic or composite material, most preferably Solvay IXEF 1022, Ryton R-4, or IXEF 1521.

Sealed electrical enclosure 310 further includes an actuating mechanism 320 that allows for the manipulation of the switches of circuit breakers or other electrical components positioned within the enclosure 310. The actuating mechanism 320 provides for linear actuation, although rotary actuation could be used as well. Enclosure 310 may be used to house various types of circuit breakers and other electrical components such as circuit interrupters, motor switches, GFI devices, contactors, and photocells to name a few. Further, enclosure 310 may be used to house both IEC and NEC approved products.

As shown in FIGS. 22 and 23, electrical buses 330, 332, and 334 extend from a point within the enclosure 10 through a first sidewall 40 to a point external to the enclosure 10 as shown. In this manner, circuit breakers or other electrical products may be positioned entirely within enclosure 310 and electrically connected to electrical terminals in an electrical panel box (not shown). The first and second housings also include mounting footprints or lugs that can be used for attaching the sealed enclosure 310 within an electrical panel box. Using the configuration shown, sealed enclosure 310 provides for a flame proof housing for use in Class I, Division 2 applications, and in hazardous locations or areas classified by divisions or zones such as Class I, Zone 1.

With the configuration of sealed electrical enclosure 310, by removing screws 322, second housing 314 may be removed from first housing 312. As a result, the circuit breakers or other electrical products positioned within the enclosure 310 may be removed and replaced, while allowing sealed electrical enclosure 310 to be reused.

As shown in FIG. 23, an actuating mechanism 320 is shown that includes a through rod 352 that slidably extends through side wall 340 and hollow screw 342. Through rod 352 is attached to switch manipulator 358 such that when through rod 352 is pushed in or out of the sealed enclosure it can manipulate the switch 359 of a circuit breaker 360 or other electrical device. Thus, a circuit breaker or other electrical device may be operated in a manner external to the sealed enclosure 310. To properly seal the sealed enclosure 310, as shown in FIGS. 23 and 24, second housing 314 includes labyrinth channel 380 that is adapted to receive a corresponding labyrinth extension 370 of the first housing 312 to form a labyrinth seal or joint. A serrated joint could also be used, or a combination of a serrated joint and a labyrinth joint.

An alternate construction for a sealed electrical enclosure disclosed and discussed above in FIGS. 1-5 is shown in FIGS. 25, 26*a-c*. FIG. 25 is an exploded view of sealed electrical enclosure 410 having a top housing 412 and a bottom housing 414, first side wall 416, and second side wall 416. First side wall 416 may be secured to bottom housing 414 using screws 425. Second side wall 418 may be secured to an opposite side of bottom housing 414 using screws 422. Top housing 414 may be removably secured to the bottom housing 414 and side walls 414 and 418 using screws 423 that may be screwed directly into the top surface of the side walls and the bottom housing 414. It is also contemplated that the screws be screwed into threaded engagement with the top housing 412. Of course, it is not required to use screws, but any other suitable means of removably securing side walls 416 and 418, or top housing 414 to bottom housing 414 could be used such as clips, bolts, clamps, latches, etc. Preferably side walls, 416 and 418, and bottom housing 414 and top housing 412 are comprised of hard non-conductive material such as a plastic or composite material, most preferably Solvay IXEF 1022, Ryton R-4, or IXEF 1521. While this embodiment shows two oppositely disposed side walls, it is also within the scope of the present invention to include a combination of a side wall and end wall, use a single side wall, or to have some combination of side wall, end wall, bottom wall, and top wall.

Sealed electrical enclosure 410 further includes an actuating mechanism 420 that allows for the manipulation of the switches of circuit breakers or other electrical components positioned within the enclosure 410. Actuating mechanism 420 is the same as that shown in FIG. 1 and described above. Of course, other actuating mechanisms, including others described herein could be used as well. As with the sealed enclosures discussed above, enclosure 410 may be used to house various types of circuit breakers and other electrical components such as circuit interrupters, motor switches, GFI devices, contactors, and photocells to name a few. Further, enclosure 410 may be used to house both IEC and NEC approved products.

To properly seal the sealed enclosure 410, as shown in FIGS. 25 and 26*a-c*, a labyrinth joint of the type described in the embodiments above may be used. In particular, a labyrinth joint 475 is formed between top housing 412 and bottom housing 414. Similarly, a labyrinth joint 476 is formed between side walls 416 and 418 and bottom housing 414. Further, labyrinth joint 477 is formed between top housing 412 and side walls 416 and 418. A serrated joint could also be used, or a combination of a serrated joint and a labyrinth joint as well.

As shown in FIGS. 25, 26*b*, and 26*b*, electrical buses 430, 432, and 434 extend from a point within the enclosure 410 through a first sidewall 440 to a point external to the enclosure 410 as shown. In this manner, circuit breakers or other electrical products may be positioned entirely within enclosure 410 and electrically connected to electrical terminals in an electrical panel box (not shown). Using the configuration shown, sealed enclosure 410 provides for a flame proof housing for use in Class I, Division 2 applications, and in hazardous locations or areas classified by divisions or zones such as Class I, Zone 1.

With the configuration of sealed electrical enclosure 410, by removing screws 423, top housing 412 may be removed from bottom housing 412 and side walls 416 and 418. As a result, the circuit breakers or other electrical products positioned within the enclosure 410 may be removed and replaced, while allowing sealed electrical enclosure 410 to be reused.

While certain features and embodiments of the present application have been described in detail herein, it is to be understood that the application encompasses all modifications and enhancements within the scope and spirit of the following claims.

We claim:

1. A sealed electrical enclosure for use in hazardous locations for enclosing circuit breakers or other electrical components comprising:

- a bottom housing having a first end wall and a second end wall opposite the first end wall;
- a top housing positioned above the bottom housing thereby creating an internal opening adapted to receive one or more F Frame circuit breakers;
- a labyrinth joint or serrated joint being formed between the bottom housing and the top housing;
- the bottom housing adapted to receive one or more circuit breakers or other electrical components;
- a first metal bus extending from a point internal to the bottom housing through the first end wall to a point external to the bottom housing;
- a second metal bus extending from a point internal to the bottom housing through the second end wall to a point external to the bottom housing;

where the first metal bus and the second metal bus are adapted to contact the first and second electrical terminals of a first circuit breaker when placed within the bottom housing;

a first actuating mechanism positioned on the top housing adapted for manipulating one or more switches of circuit breakers or electrical components positioned within the bottom housing;

a first vent positioned on the top housing for dissipating pressure buildup within the housing;

wherein the top housing is removably secured to the bottom housing screws or bolts that are threaded into threaded inserts positioned in the bottom housing to allow for removal and replacement of circuit breakers or other electrical components within the housing; and further including a first lug retaining bracket secured to the bottom housing and extending to a position beneath the first metal bus.

2. The sealed electrical enclosure of claim 1, wherein the first vent is comprised of sintered bronze.

3. The sealed electrical enclosure of claim 1, further including a third metal bus extending from a point internal to the bottom housing through the first end wall to a point external to the bottom housing;

a fourth metal bus extending from a point internal to the bottom housing through the second end wall to a point external to the bottom housing;

where the third metal bus and the fourth metal bus are adapted to contact the first and second electrical terminals of a second circuit breaker when placed within the bottom housing.

4. The sealed electrical enclosure of claim 1, further including a second vent positioned on the bottom housing for dissipating heat and pressure buildup within the housing.

5. The sealed electrical enclosure of claim 1, wherein the enclosure may be used in Class I Division 2 and Class I Zone 1 applications.

6. The sealed electrical enclosure of claim 1, wherein the bottom housing and top housing may be secured together using metal threaded inserts that are press fit into the bottom housing and wherein the metal threaded inserts have M8×1.25 pitch internal threads.

7. The sealed electrical enclosure of claim 1, wherein the bottom housing further comprises a first side wall removably secured to the first end wall and the second end wall, and a second side wall positioned opposite the first side wall and removably secured to the first end wall and the second end wall.

8. The sealed electrical enclosure of claim 3, further including a fifth metal bus extending from a point internal to the bottom housing through the first end wall to a point external to the bottom housing;

a sixth metal bus extending from a point internal to the bottom housing through the second end wall to a point external to the bottom housing;

where the fifth metal bus and the sixth metal bus are adapted to contact the first and second electrical terminals of a third circuit breaker when placed within the bottom housing.

9. The sealed electrical enclosure of claim 1, wherein the bottom housing is adapted to receive F-frame circuit breakers.

10. The sealed electrical enclosure of claim 1, wherein the bottom housing is adapted to receive QC-series circuit breakers.

11. The sealed electrical enclosure of claim 3, wherein the first, second, third, and fourth buses are adapted to electrically connect to electrical terminals within an electrical panel box.

12. The sealed electrical enclosure of claim 1, wherein the first actuating mechanism includes a rigid rod that slidably moves within an interior of the top housing.

13. The sealed electrical enclosure of claim 7, wherein a labyrinth joint is formed between the top housing and a surface of the first side wall and between the top housing and a surface of the second side wall.

14. The sealed electrical enclosure of claim 1, wherein the labyrinth joint or serrated joint comprises a combination of a labyrinth joint and a serrated joint.

15. The sealed electrical enclosure of claim 1, wherein the bottom housing is adapted to receive one or more non-explosion proof circuit breakers and may operate in Class I, Division 2 and Class I Zone 1 applications.

16. The sealed electrical enclosure of claim 1, wherein the top housing may be removed from the bottom housing to allow for removal and replacement of circuit breakers or other electrical components positioned therein.

17. The sealed electrical enclosure of claim 1, wherein a second actuating mechanism is positioned on the top housing for manipulating the switch of a second circuit breaker positioned within the housing, such that the first actuating mechanism and the second actuating operate independently to manipulate the switches of different circuit breakers positioned within the bottom housing.

18. The sealed electrical enclosure of claim 1, wherein the first actuating mechanism includes a knob or extension such that the first actuating mechanism may be operated when the sealed electrical housing is positioned within an electrical panel box.

19. The sealed electrical enclosure of claim 1, wherein circuit breakers positioned within the bottom housing may be electrically connected to electrical terminals positioned within an electrical panel box after the top housing is secured to the bottom housing.

20. The sealed electrical enclosure of claim 1, wherein the enclosure is arc-flash proof.

21. The sealed electrical enclosure of claim 3, wherein the first, second third, and fourth buses are set in the first and second sidewalls of the bottom housing during a molding process.

22. The sealed electrical enclosure of claim 1, wherein the sealed enclosure is adapted for installment within an electrical panel box via four mounting brackets positioned on the bottom of the bottom housing.

23. A sealed electrical enclosure for use in hazardous locations for enclosing circuit breakers or other electrical components comprising:

a bottom housing having a first end wall and a second end wall opposite the first end wall;

a top housing positioned above the bottom housing thereby creating an internal opening adapted to receive one or more F Frame circuit breakers;

a labyrinth joint or serrated joint being formed between the bottom housing and the top housing;

the bottom housing adapted to receive one or more circuit breakers or other electrical components;

a first metal bus extending from a point internal to the bottom housing through the first end wall to a point external to the bottom housing;

a second metal bus extending from a point internal to the bottom housing through the second end wall to a point external to the bottom housing;

where the first metal bus and the second metal bus are adapted to contact the first and second electrical terminals of a first circuit breaker when placed within the bottom housing;

a first actuating mechanism positioned on the top housing adapted for manipulating one or more switches of circuit breakers or electrical components positioned within the bottom housing;

a first vent positioned on the top housing for dissipating pressure buildup within the housing;

wherein the top housing is removably secured to the bottom housing screws or bolts that are threaded into threaded inserts positioned in the bottom housing to allow for removal and replacement of circuit breakers or other electrical components within the housing; and wherein the actuating mechanism includes a handle having a throughhole that aligns with a throughhole of a first locking flange positioned on the actuating mechanism when the handle is in a first position such that a lock may be placed through both through holes to secure the handle in the first position.

24. The sealed electrical enclosure of claim 6, wherein six threaded screws are used to secure the top housing to the bottom housing.

25. The sealed electrical enclosure of claim 23, wherein the handle is movable from the first position to a second position where the throughhole on the handle is aligned with a throughhole on a second locking flange when the handle is in the second position.

26. The sealed electrical enclosure of claim 1, wherein the distance between the end of the lug retaining bracket and the bottom of the first metal bus is such that a bottom portion of a connector assembly may fit within the space between the end of the lug retaining bracket and the bottom of the first metal bus.

27. A sealed electrical enclosure for use in hazardous locations for enclosing circuit breakers or other electrical components comprising:

a bottom housing having a first end wall and a second end wall opposite the first end wall;

a top housing positioned above the bottom housing;

a labyrinth joint being formed between the bottom housing and the top housing;

the bottom housing adapted to receive one or more circuit breakers or other electrical components;

a first metal bus extending from a point internal to the bottom housing through the first end wall to a point external to the bottom housing;

a second metal bus extending from a point internal to the bottom housing through the second end wall to a point external to the bottom housing;

where the first metal bus and the second metal bus are adapted to contact the first and second electrical terminals of a first circuit breaker when placed within the bottom housing;

a first actuating mechanism positioned on the top housing adapted for manipulating one or more switches of circuit breakers or electrical components positioned within the bottom housing, wherein the actuating mechanism includes a handle having a throughhole that aligns with a throughhole of a first locking flange positioned on the actuating mechanism when the handle is in a first position such that a lock may be placed through both through holes to secure the handle in the first position;

and wherein the top housing is removably secured to the bottom housing to allow for removal and replacement of circuit breakers or other electrical components within the housing.

28. The sealed electrical enclosure of claim 27, wherein the handle is movable from the first position to a second position where the throughhole on the handle is aligned with a throughhole on a second locking flange when the handle is in the second position.

29. The sealed electrical enclosure of claim 28, wherein the sealed enclosure is adapted for installment within an electrical panel box via four mounting brackets positioned on the bottom of the bottom housing.

30. The sealed electrical enclosure of claim 27, further including a first lug retaining bracket secured to the bottom housing and extending to a position beneath the first metal bus;

and wherein the distance between the end of the lug retaining bracket and the bottom of the first metal bus is such that a bottom portion of a connector assembly may fit within the space between the end of the lug retaining bracket and the bottom of the first metal bus.

31. A sealed electrical enclosure for use in hazardous locations for enclosing circuit breakers or other electrical components comprising:

a bottom housing having a first end wall and a second end wall opposite the first end wall;

a top housing positioned above the bottom housing;

a labyrinth joint or a serrated joint being formed between the bottom housing and the top housing;

the bottom housing adapted to receive one or more circuit breakers or other electrical components;

a first metal bus extending from a point internal to the bottom housing through the first end wall to a point external to the bottom housing;

a second metal bus extending from a point internal to the bottom housing through the second end wall to a point external to the bottom housing;

where the first metal bus and the second metal bus are adapted to contact the first and second electrical terminals of a first circuit breaker when placed within the bottom housing;

a first actuating mechanism positioned on the top housing adapted for manipulating one or more switches of circuit breakers or electrical components positioned within the bottom housing;

a first lug retaining bracket secured to the bottom housing and extending to a position beneath the first metal bus; wherein the distance between the end of the lug retaining bracket and the bottom of the first metal bus is such that a bottom portion of a connector assembly may fit within the space between the end of the lug retaining bracket and the bottom of the first metal bus; and wherein the top housing is removably secured to the bottom housing to allow for removal and replacement of circuit breakers or other electrical components within the housing.

32. The sealed enclosure of claim 31 further including a second lug retaining brackets secured to the bottom housing and extending to a position beneath the second metal bus; wherein the distance between the end of the second lug retaining bracket and the bottom of the second metal bus is such that a bottom portion of a connector assembly may fit within the space between the end of the second lug retaining bracket and the bottom of the second metal bus.

* * * * *